(12) United States Patent
Krühler

(10) Patent No.: US 7,029,943 B2
(45) Date of Patent: Apr. 18, 2006

(54) PHOTOVOLTAIC COMPONENT AND MODULE

(75) Inventor: Wolfgang Krühler, Unterhaching (DE)

(73) Assignee: Shell Oil Company, Houston, TX (US)

( * ) Notice: Subject to any disclaimer, the term of this patent is extended or adjusted under 35 U.S.C. 154(b) by 131 days.

(21) Appl. No.: 10/380,150

(22) PCT Filed: Sep. 13, 2001

(86) PCT No.: PCT/EP01/10653

§ 371 (c)(1),
(2), (4) Date: Mar. 31, 2003

(87) PCT Pub. No.: WO02/23639

PCT Pub. Date: Mar. 21, 2002

(65) Prior Publication Data

US 2004/0043528 A1    Mar. 4, 2004

(30) Foreign Application Priority Data

Sep. 13, 2000    (DE) ................................ 100 45 249

(51) Int. Cl.
*H01L 21/00*    (2006.01)
(52) U.S. Cl. ............................ 438/57; 438/80; 438/93; 438/98
(58) Field of Classification Search .......... 438/46–465; 136/57–98
See application file for complete search history.

(56) References Cited

U.S. PATENT DOCUMENTS

| 4,478,879 | A | | 10/1984 | Baraona et al. ................ 427/85 |
| 5,641,362 | A | * | 6/1997 | Meier .......................... 136/256 |
| 6,096,968 | A | * | 8/2000 | Schlosser et al. ........... 136/256 |
| 6,143,976 | A | * | 11/2000 | Endros ........................ 136/256 |
| 6,262,359 | B1 | * | 7/2001 | Meier et al. ................. 136/256 |
| 6,333,457 | B1 | * | 12/2001 | Mulligan et al. ........... 136/255 |
| 6,461,947 | B1 | * | 10/2002 | Uematsu et al. ........... 438/542 |
| 6,524,880 | B1 | * | 2/2003 | Moon et al. .................. 438/57 |
| 2004/0261839 | A1 | * | 12/2004 | Gee et al. .................... 136/256 |
| 2005/0016585 | A1 | * | 1/2005 | Munzer ....................... 136/261 |

FOREIGN PATENT DOCUMENTS

| DE | 4343296 | 6/1995 |
| DE | 19525720 | 1/1997 |
| DE | 19813188 | 7/1999 |
| JP | 64-082571 | 3/1989 |
| WO | 98/25312 | 6/1998 |

OTHER PUBLICATIONS

International Search Report dated Jan. 17, 2002.

* cited by examiner

*Primary Examiner*—Savitri Mulpuri

(57) ABSTRACT

A photovoltaic component with at least one silicon wafer that has a certain basic doping, a light-receiving side, and electric bonding side opposite the light-receiving side, and at least one interdigital semiconductor structure arranged on the electric bonding side with at least one n-type semiconductor part-structure and at least one p-type semiconductor part-structure arranged at a certain interval to the n-type semiconductor part-structure. One of the semiconductor part-structures and the silicon wafer thus forms a p-n junction. The silicon wafer may be a tri-crystalline wafer.

9 Claims, 4 Drawing Sheets

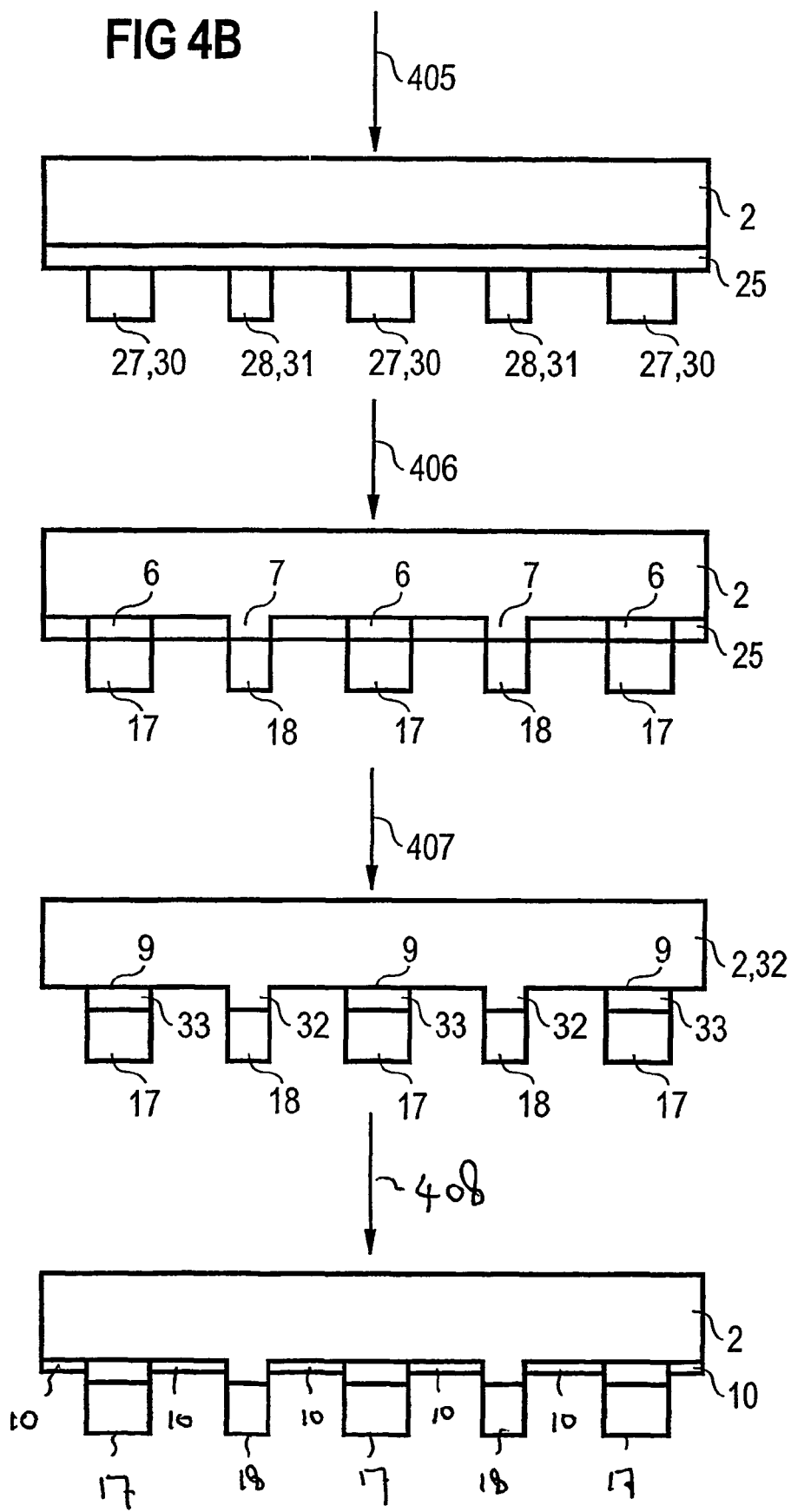

PHOTOVOLTAIC COMPONENT AND MODULE

FIELD OF THE INVENTION

The invention relates to a method of manufacturing a photovoltaic component with a silicon wafer and to a photovoltaic module with at least one silicon wafer. The silicon wafer has a predetermined basic doping, a light-receiving side, an electric bonding side facing away from the light-receiving side, and at least one interdigital semiconductor structure arranged on the electric bonding side with at least one n-type semiconductor part-structure and at least one p-type semiconductor part-structure arranged at a predetermined distance from the n-type semiconductor part-structure. One of the semiconductor part-structures forms a p-n junction with the silicon wafer.

BACKGROUND OF THE INVENTION

An example of a photovoltaic component is disclosed in International patent application publication No. 98/25 312. This publication relates to a conventional photovoltaic component, wherein a p-n junction is formed at the light-receiving side of a p-doped silicon wafer. It is proposed to make an electric contact between the light-receiving side at the backside of the wafer. To this end, the silicon wafer is cut into strips. Each strip is first provided with an n-doped emitter layer that covers all of its surfaces and on top of that layer a passivating layer is arranged. Then a first set of contacts is made on the backsides of the strips, which contacts are p-doped and extend through the passivating layer and the emitter layer into the silicon wafer, and a second set of contacts is made, that are arranged in the slits and extend through the passivating layer into the emitter layer so as to form an electric contact with that emitter layer. The emitter layer and the second set of contacts provide an electric connection between the front side of the silicon wafer to its backside.

Another photovoltaic component is disclosed in German patent application publication No. 195 25 720.

Manufacturing the known photovoltaic component comprises the steps of (a) providing a silicon wafer having a light-receiving side and an electric bonding side opposite to the light-receiving side with a predetermined basic doping in the form of a p-type doping;

(b) providing the silicon wafer with a passivating layer at the electric bonding side;

(c) making a plurality of grooves arranged one next to the other in the passivating layer at the electric bonding side, which grooves can extend into the silicon wafer;

(d) making at the grooves n-type doping areas in the silicon wafer to obtain n-type semiconductor part-structure;

(e) making a plurality of p-type thick-film electric contacts on the passivating layer, between adjacent grooves to obtain p-type semiconductor part-structure and a contacting part-structure; and (f) making in each of the grooves a thin film contact to obtain an auxiliary contacting part-structure.

The photovoltaic component is a solar cell that serves to convert electromagnetic energy into electrical energy. The centrepiece of the component is a silicon wafer. The silicon wafer is a flat, mono-crystalline body of silicon with two main surfaces directed opposite to each other. The thickness of the silicon wafer is normally about 160 μm (micrometer) or more, which is substantially smaller than a lateral extension (diameter) of the silicon wafer. The lateral extension of the silicon wafer for example is about 10 cm.

The silicon wafer has silicon as its semiconductor base material. Additionally the silicon wafer has a predetermined basic doping. A predetermined basic doping is understood to mean the introduction of a predetermined dopant or impurity atom into a base material for changing one electrical property of the base material. Doping can result in two types of conductivity, the p-type conductivity and the n-type conductivity. A suitable dopant for silicon is an element of the third main group of the periodic table for producing p-type conductivity and an element of the fifth main group of the periodic table for producing n-type conductivity.

The silicon wafer has a light-receiving side (front side), which can be provided with a texture. When the photovoltaic component is in operation, electromagnetic radiation reaches into the silicon wafer via the light-receiving side. For supplying electric energy to an external circuit an interdigital semiconductor structure is arranged on the electric bonding side (rear side) of the silicon wafer. This semiconductor structure consists of an n-type semiconductor part-structure and a p-type semiconductor part-structure. One of the semiconductor part-structures together with the silicon wafer forms the p-n junctions, which are necessary for the production of the photocurrent.

The semiconductor part-structures are arranged at a predetermined distance to each other. This means that there are no p-n junctions between the interdigital semiconductor part-structures. The semiconductor part-structures are for example grid-like or finger-like. They consist of a plurality of webs, wherein one web of a semiconductor part-structure is separated from a web of the other semiconductor part-structure for example by a groove or an interval. The semiconductor part-structures engage with each other in such a way that one surface is as large as possible, which is produced by the p- and n-conducting semiconductor part-structures arranged opposite each other.

One of the semiconductor part-structures together with the silicon wafer forms a base of the photovoltaic component. The other semiconductor part-structures forms an emitter of the photovoltaic component. For electrically contacting the interdigital semiconductor structure an interdigital contacting structure is mounted on the interdigital semiconductor structure with a semiconductor part-structure for electrically contacting the n-type semiconductor part-structure, and a contacting part-structure for electrically contacting the p-type semiconductor part-structure.

SUMMARY OF THE INVENTION

It is an object of the present invention to provide a simple method of producing an electric bonding side of a photovoltaic component based on a silicon wafer.

To this end the present invention provides a method of manufacturing a photovoltaic component, wherein said method comprises providing a silicon wafer having a predetermined basic doping, a light-receiving side and an electric bonding side opposite to the light-receiving side and wherein the method further comprises the steps of:

(a) producing a doped layer on the electric bonding side of the silicon wafer only, wherein the doping of the doped layer differs from the predetermined basic doping of the silicon wafer to get a p-n junction in the silicon wafer;

(b) applying on the doped layer an n-type dopant for producing an n-type semiconductor part-structure and a p-type dopant for producing a p-type semiconductor part-structure of an interdigital semiconductor structure, and allowing the dopants to diffuse into the doped layer, thereby forming the semiconductor part-structures; and (c) separating the semiconductor part-structures by removing the doped layer in the intervals between the semiconductor part-structures.

BRIEF DESCRIPTION OF THE DRAWING

The invention will now be will now be further illustrated by way of example with reference to the accompanying drawings, wherein FIGS. 1a and 1b each show schematically a photovoltaic component in cross-section;

FIGS. 4a and 4b show schematically various process stages for manufacturing the photovoltaic components.

DETAILED DESCRIPTION OF THE INVENTION

Figure 1A:
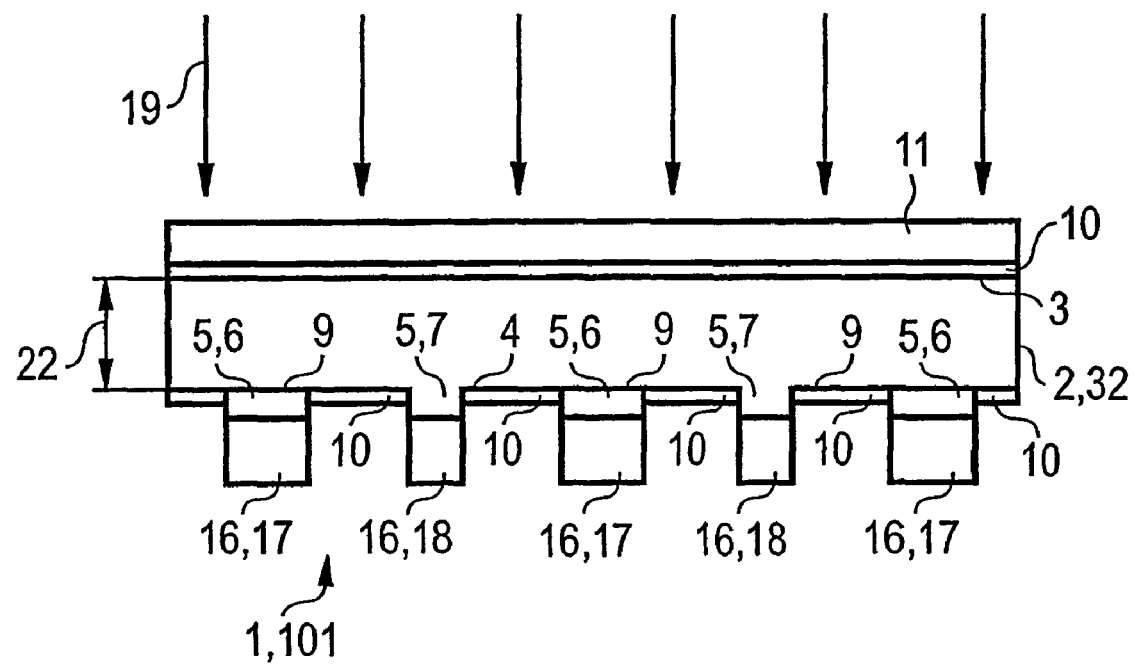

An advantage of the method according to the present invention is that no grooves have to be made in the passivating layer, and therefore the method according to the present invention is more simple and economical.

The layer thickness of the silicon wafer is limited to 160 μm or more. This is explained by the fact that the photovoltaic component of the type in question is equipped with a mono-crystalline silicon wafer. A layer thickness below 160 μm does not guarantee mechanical stability of the mono-crystalline silicon wafer. In order to have a silicon wafer that has a smaller thickness, the silicon wafer is suitably a tri-crystalline silicon wafer, as described in German patent application publication No. 43 43 296 which is hereby incorporated by reference.

According to the method of the invention a so-called reverse side bonding of the silicon wafer or the photovoltaic component takes place. In this way the shading of a photovoltaic component can be prevented with a silicon wafer and at the same time mechanical stability of the silicon wafer can be guaranteed at a layer thickness of below 160 μm.

The predetermined basic doping of the silicon wafer is either an n- or p-type basic doping, wherein the n-type doping is dominated by negative charges (electrons) and the p-type is dominated by positive charges (holes). Accordingly either the n-type semiconductor part-structure or the p-type semiconductor part-structure forms with the silicon wafer the p-n junction. This means that the silicon wafer together with one of the semiconductor part-structures forms the base of the photovoltaic component. The emitter of the photovoltaic component is formed by the other semiconductor part-structure.

The absorption of a photon by the photoactive material of the silicon wafer causes a charge separation to take place. The doping causes a certain minority charge carrier to be formed. In the case of a p-type doping the minority charge carrier is an electron, in the case of an n-type doping the minority charge carrier is a "positively charged" electron hole. The doped layer has a doping that is directed opposite to the predetermined basic doping of the silicon wafer. This means that in the case of an n-type basic doping of the silicon wafer, the layer doping of the doped layer is p-type and vice versa.

According to further embodiment the light-receiving side and/or the electric bonding side of the silicon wafer are provided with a passivation layer. The passivation layer is directly applied on a surface of the silicon wafer and reduces primarily the possibility that a surface-charge-recombination occurs which reduces a photocurrent. The passivation layer on the electric bonding side additionally takes over the task of an electrical insulation of the p- and n-type semiconductor part-structures against each other. The passivation layer is located in an interval between the p- and n-type semiconductor part-structures. The passivation layer contains in particular a passivating agent that is selected from the group silicon oxide and/or silicon nitride.

In a further embodiment, at least one encapsulation layer is applied on the passivation layer, wherein the encapsulation layer comprises at least one transparent material. Especially an encapsulation on the passivation layer on the light-receiving side consists of the transparent material. The transparent material ensures that the electromagnetic radiation can penetrate the photo-electrically active silicon wafer. Preferably the transparent material is photostable. This means that a transmission of the encapsulation from the transparent material remains essentially constant during the operation of the photovoltaic component. The transmission for a certain wavelength of the electromagnetic radiation will not be reduced for example by a photo-induced process. The encapsulation is transparent preferably in the region between 300 nm (nanometer) and 1200 nm. In this region the silicon absorbs electromagnetic radiation necessary for the charge separation. In particular the transparent material is selected from the group glass and/or ethyl-vinyl-acetate (EVA). Apart from this it is possible to use any other synthetic material that is photostable under the conditions of use of the photovoltaic component. The conditions of use relate for example to one wavelength region and one intensity of the electromagnetic radiation.

The invention further relates to a photovoltaic module having a light-receiving side and an electric bonding side opposite the light-receiving side, which module comprises a plurality of silicon wafers having a predetermined basic doping, wherein;

the silicon wafers have a light-receiving side and an electric bonding side opposite the light-receiving side;

the wafers are so arranged that the light-receiving sides of the wafers form the light-receiving side of the photovoltaic module, the electric bonding sides form the electric bonding side of the photovoltaic module, and electric connections between the silicon wafers are at the electric bonding side; and the wafers are provided at the electric bonding sides with at least one interdigital semiconductor structure comprising at least one n-type semiconductor part-structure provided with a first contacting part-structure and at least one p-type semiconductor structure provided with a second contacting part-structure, wherein either the n-type semiconductor part-structure or the p-type semiconductor part-structure forms with the wafer a p-n junction.

Each silicon wafer itself forms a photovoltaic component in the form solar cell. The chain of silicon wafers together forms a solar module. The special advantage of such an arrangement consists in the fact that an electrical contact to the p-type semiconductor part-structure and to the n-type semiconductor part-structure is arranged on one side of the silicon wafer and thus can be easily manufactured by automation. Tape lapping, interconnecting, laminating and encapsulating the solar cells or solar modules significantly increases the yield compared to the electric bonding of the solar cells on both sides. Obsolete is a complicated interconnection of several solar cells into a solar module, in which the light-receiving sides and the bonding sides of the solar cells must be connected tension-free by a folded or curved metal contact strip.

The photovoltaic component 1 is a solar cell 101 and consists of a silicon wafer 2 (FIG. 1*a*). The silicon wafer 2 has boron as its dopant and thus the predetermined basic doping is a p-type doping.

The silicon wafer 2 has a layer thickness 22 of approximately 100 µm. The silicon wafer has a light-receiving side 3. During operation of the photovoltaic component 1 electromagnetic radiation 19 enters the photo-electrically active silicon wafer 2. On the light-receiving side 3 of the silicon wafer 2 is arranged a passivation layer 10 of silicon oxide. An encapsulation 11 is arranged over the passivating layer 10. The encapsulation 11 is an anti-reflex layer for increasing light coupling into the silicon wafer 2. The silicon wafer 2 further comprises an electric bonding side 4 that is at the side of the silicon wafer 2 opposite to the light-receiving side 3. On the electric bonding side 4 is arranged an interdigital semiconductor structure 5. The semiconductor structure 5 consists of an n-type semiconductor part-structure 6 and a p-type semiconductor part-structure 7.

Figure 2:
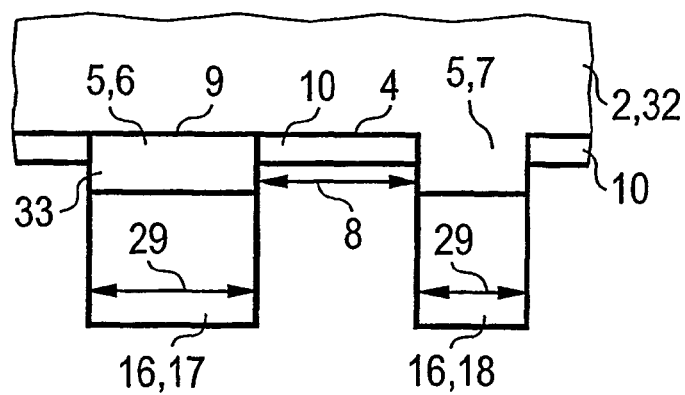
FIG. 2 shows schematically a cut-out of a photovoltaic component in cross-section.

These semiconductor part-structures are arranged such that there is an intervening space or interval 8 between them (see FIG. 2). The n-type semiconductor part-structure 6 and p-type semiconductor part-structure 7 do not have a common p-n junction. In contrast to this, the n-type semiconductor part-structure 6 and the p-type doped silicon wafer 2 form a p-n junction 9.

The electric bonding side 4 also has a passivation layer 10. The passivation layer 10 is arranged on a surface of the electric bonding side 4 between the interdigital semiconductor structures 6 and 7. The passivation layer 10 not only serves to reduce the photocurrent reducing surface-charge-recombination of the separated charge carriers. The passivation layer 10 also serves to electrically insulate the n-type semiconductor part-structure 6 and the p-type semiconductor part-structure 7 from each other.

In order to allow an electric contact with the photovoltaic component 1, the interdigital semiconductor structure 5 is provided with an interdigital contacting structure 16 comprising a first contacting part-structure 17 for an electric connection with the n-type semiconductor part-structure 6 and a second contacting part-structure 18 for an electric connection with the p-type semiconductor part-structure 7. The web width of the interdigital contacting structure 16 corresponds essentially the web width of the interdigital semiconductor structure 5.

Figure 3A:
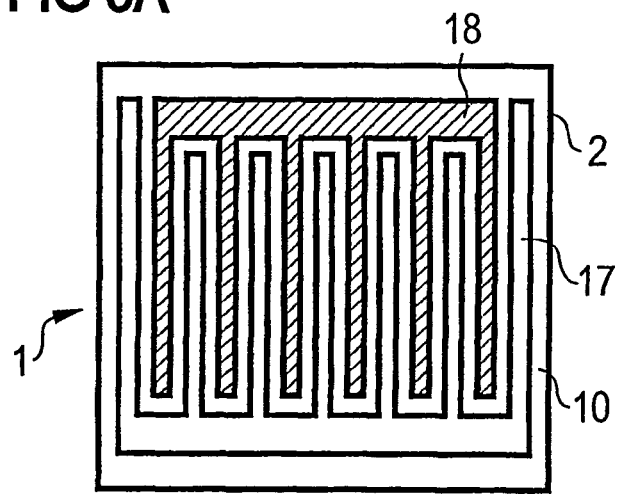
FIGS. 3a and 3b each show schematically an interdigital bonding structure in plan view.
Figure 3B:
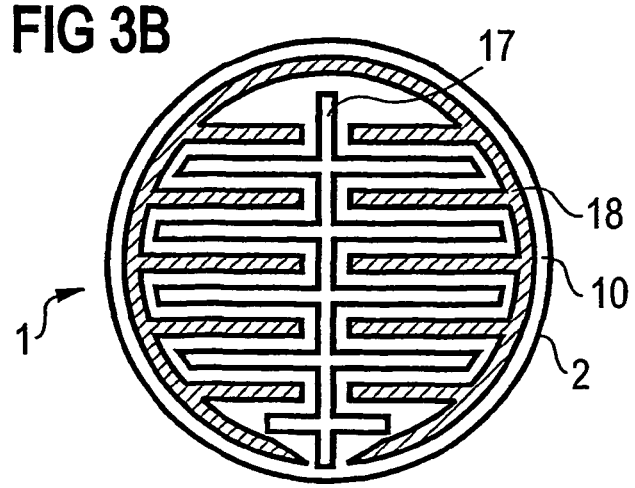

A first possible interdigital contacting structure 16 and therefore also an interdigital semiconductor structure 5 is indicated in FIG. 3*a*. First and second contacting part-structures 17 and 18 and therefore the n-type semiconductor and p-type part-structures 6 and 7 thus form a comb-like or finger-like structure. These part-structures interengage without touching each other. An alternative embodiment to the interdigital contacting structure 16 and the interdigital semiconductor structure 5 is reproduced in FIG. 3*b*.

Figure 1B:
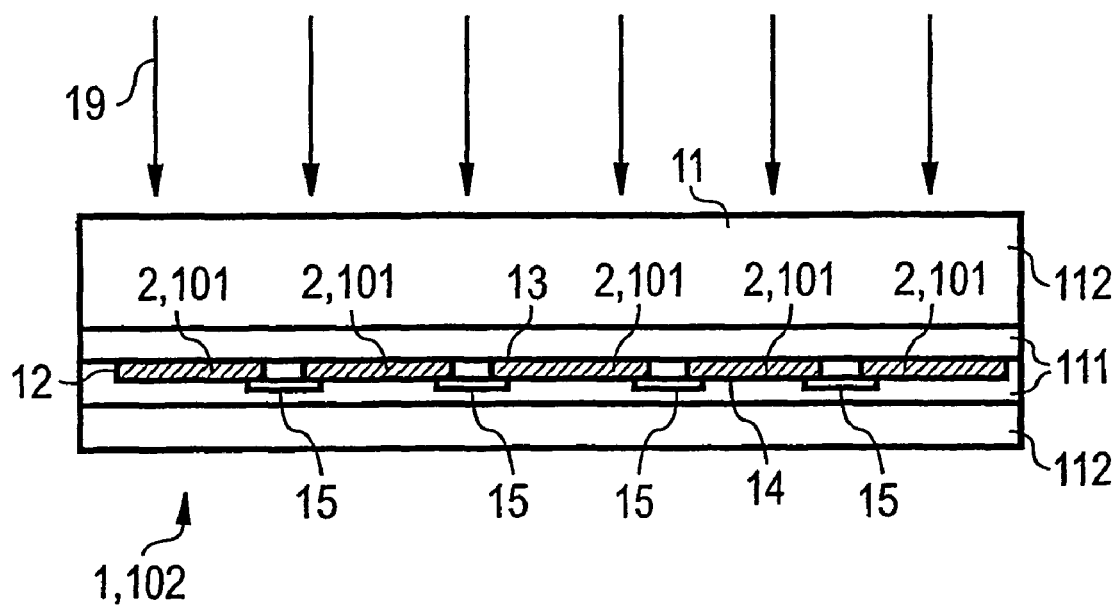

The invention further provides a photovoltaic component 1 in the form of a photovoltaic module 102, see FIG. 1*b*. The photovoltaic module 102 comprises a plurality of silicon wafers 2 (solar cells 101) described above. The silicon wafers 2 of the solar module 102 are arranged to form a chain 12 in such a way that light-receiving sides 3 of the silicon wafers 2 form a common light-receiving side 13 of the photovoltaic module 102, and the electric bonding sides 4 of the silicon wafers 2 form a common bonding side 14 of the photovoltaic module 102. The silicon wafers 2 are arranged side by side equally oriented. The chain 12 of the silicon wafers 2 is a solar module 102 which is formed of an easily to manufacture electrical serial inter-connection 15 of the individual silicon wafers 2 or the individual solar cells 101. The solar module 102 as a whole is embedded in an encapsulation 111 of ethyl-vinyl-acetate. The encapsulation 111 together with the solar module 102 is embedded in a second encapsulation 112 of glass. In an alternative embodiment to this the outer encapsulation consists of a glass of different transparent material.

Figure 4A:
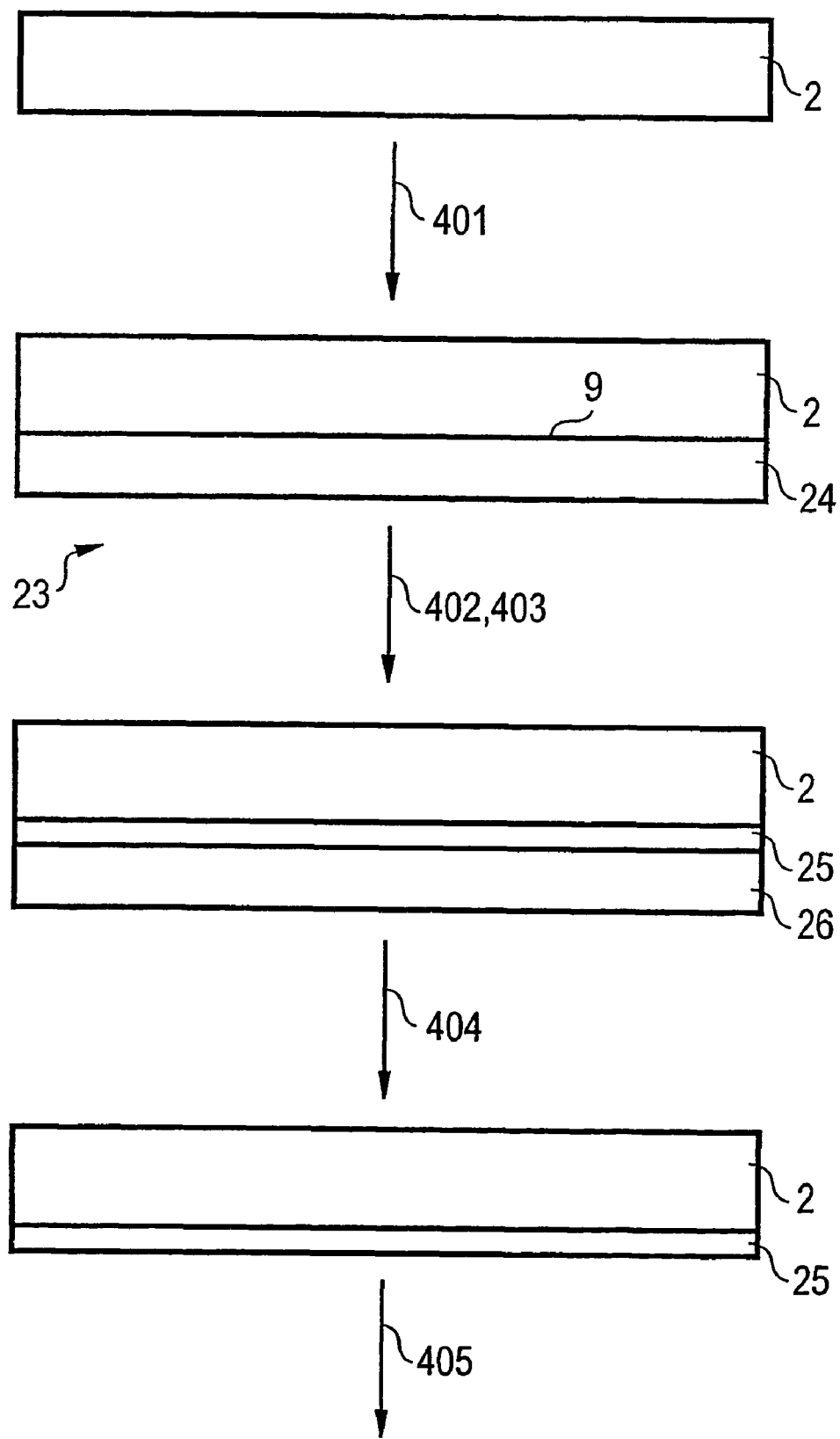

Reference is now made to FIGS. 4*a* and 4*b* showing several stages of the method according to the present invention.

In the method of the present invention at first a silicon wafer 2 having a light-receiving side and an electric bonding side opposite to the light-receiving side with a predetermined basic doping is provided. To this end a silicon wafer is sawn from crystal of p-type doped silicon (boron doping). The silicon wafer is cleaned by a conventional method and any surface unevennesses removed by etching. During sawing it is possible that a micro-crack appears on the surface of the silicon wafer that can be removed by the etching process. This causes the mechanical stability of the silicon wafer to be increased.

Liquid phosphorous-containing composition is flung onto the electric bonding side 4 of the silicon wafer 2 to be manufactured (work stage 401). A suitable composition is phosphorous-Siodop B-430, from Merck, which contains phosphorous ions and a mixture of tetraethyl silicate, ethanol, ethyl acetate and acetic acid (phosphorous-Siodop is a trademark). Applying the composition results in a layer composite 23 of silicon wafer and applied thereon phosphorous-containing layer 24. The phosphorous-layer 24 is a few µm thick. The layer composite 23 is heated at approximately 200° C. for 10 min, which causes the phosphorous-containing layer to harden (work stage 402).

The phosphorous is then diffused from the hardened phosphorous-containing layer into the p-type silicon wafer 2 (work stage 403). The production of the doped layer 25 with n-type doping takes place. This is achieved at a temperature of approximately 850° C. whilst tempering for 30 min. The resulting doped layer 25 leads to the p-n junction 9 necessary for the operation of the photo-voltaic component 1. The doped layer 25 is a few tenths µm thick.

During hardening of the phosphorous-containing layer or during the diffusion of the phosphorous, a phosphorous-glass-layer 26 is formed. This phosphorous-glass-layer 26, after the production of the doped layer 25, is etched with aqueous hydrofluoric acid (work stage (404).

The interdigital semiconductor structure 5 is now produced on or in the doped layer 25. For this p- and n-type dopants are applied to the doped layer 25. (work stage 405). This is achieved with the aid of a screen printing method in which an n-paste 30 containing the n-type dopant 27 and a p-paste 31 containing the p-type dopant 28 are printed in a form which corresponds to the interdigital semiconductor part-structures 6 and 7 to be produced (web width 29 between 40 and 100 µm). The pastes 30 and 31 function as the sources of the n- and p-type dopants 27 and 28.

The dopants 27 and 28 are burnt-in in a continuous furnace (work stage 406). During burning-in the dopant (aluminium) contained in the p-paste 31 is driven through (fired through) the n-type doped layer 25. During this process beneath the p-paste 31 the n-doping of the doped layer 25 is overcompensated. This results in the p-type semiconductor part-structure 7 causing an electrical contact to be made with the p-type silicon wafer 2. The n-type semiconductor part-structure 6 is produced beneath the n-paste 30 during burning-in. During burning-in of the n-paste 30 an n-type character of the doped layer 25 remains.

Furthermore, during burning-in the interdigital contacting structure 16 is formed. From the p-paste 31 is produced the second contacting part-structure 18 for the electric contact of the p-type semiconductor part-structure 7 and from the n-paste 30 the first contacting part-structure 17 for electrically bonding the n-type semiconductor part-structure 6.

For electrical insulation between p-type semiconductor part-structure 6 and n-type semiconductor part-structure 7 there takes place a plasma etching of the electric bonding side 4, wherein the interdigital contacting structure 16 is used as the etching mask (work stage 407). The free spaces of the doped layer 25, which are not covered by the contacting part-structures 17 and 18, between the n- and p-type semiconductor part-structures 6 and 7 are thus etched down to the silicon wafer 2. This results in etching grooves by which the n- and p-type semiconductor part-structures are separated from each other.

The p-type semiconductor part-structure 7 and the silicon wafer 2 together form the basis 32 of the photovoltaic component 1. The n-type semiconductor part-structure 6 forms the emitter 33 of the photovoltaic component 1.

To prevent the surface-charge-recombination and for the additional insulation of the n- and p-type semiconductor part-structures 6 and 7 a passivation layer 10 of silicon oxide is formed on the surface of the silicon wafer 2 between the n- and p-type semiconductor part-structures 6 and 7 (work stage 408).

Suitably the silicon wafer is a tri-crystalline wafer, which is sawn from a tri-crystalline crystal of p-type doped silicon (boron doping).

In the above described example, the silicon wafer 2 was provided with a p-type doping, and the doped layer is of the n-type. However, in an alternative embodiment of the invention, the silicon wafer is provided with a n-type doping, and the doped layer is of the p-type. A suitable dopant for silicon is an element of the third main group of the periodic table for producing p-type doping and an element of the fifth main group of the periodic table for producing n-type doping.

The method according to the present invention allows easy manufacture of the component by automated means and it is therefore an economically attractive method. This also concerns the interconnection of the component in the form of a solar module. An efficiency rating of the component of 20% is thus possible.

I claim:

1. A method of manufacturing a photovoltaic component, wherein said method comprises providing a silicon wafer having a predetermined basic doping, a light-receiving side and an electric bonding side opposite to the light-receiving side and wherein said method further comprises the steps of:
   (a) producing a doped layer on the electric bonding side of the silicon wafer only, wherein the doping of the doped layer differs from the predetermined basic doping of the silicon wafer to get a p-n junction in the silicon wafer;
   (b) applying on the doped layer an n-type dopant for producing an n-type semiconductor part-structure and a p-type dopant for producing a p-type semiconductor part-structure of an interdigital semiconductor structure, and allowing the dopants to diffuse into the doped layer, thereby forming the semiconductor part-structures; and
   (c) separating the semiconductor part-structures by removing the doped layer in the intervals between the semiconductor part-structures.

2. The method according to claim 1, wherein the silicon wafer is a tri-crystalline silicon wafer.

3. The method according to claim 1, wherein step (b) comprises applying on the doped layer a metal paste containing an n-type dopant and a metal paste containing a p-type dopant on the doped layer, and burning-in the dopants to form the semiconductor part-structures.

4. The method according to claim 1, wherein for the basic doping of the silicon wafer p-doping is used and for producing the doped layer phosphorus is used as the dopant.

5. The method according to claim 4, wherein a liquid phosphorous-containing solution is applied on the silicon wafer to obtain a composite that is heated.

6. The method according to claim 1, further comprising applying a passivation layer on the light-receiving side and/or on the electric bonding side of the silicon wafer.

7. The method according to claim 6, wherein applying the passivation layer includes applying a layer of silicon dioxide or of silicon nitride.

8. The method according to claim 6, further comprising applying at least one encapsulation layer on the passivation layer, wherein the encapsulation layer comprises at least one transparent material.

9. The method according to claim 6, wherein the said applying the passivation layer on the electric bonding side of the silicon wafer is performed after step (c).

* * * * *